United States Patent
Kim et al.

(10) Patent No.: US 7,675,810 B2
(45) Date of Patent: Mar. 9, 2010

(54) SEMICONDUCTOR MEMORY DEVICE

(75) Inventors: Jee-Yul Kim, Kyoungki-do (KR);
Beom-Ju Shin, Kyoungki-do (KR)

(73) Assignee: Hynix Semiconductor, Inc.,
Gyeonggi-do (KR)

( * ) Notice: Subject to any disclaimer, the term of this patent is extended or adjusted under 35 U.S.C. 154(b) by 0 days.

(21) Appl. No.: 12/255,040

(22) Filed: Oct. 21, 2008

(65) Prior Publication Data

US 2009/0052271 A1 Feb. 26, 2009

Related U.S. Application Data

(62) Division of application No. 11/478,124, filed on Jun. 30, 2006, now Pat. No. 7,529,140.

(30) Foreign Application Priority Data

Sep. 29, 2005 (KR) .......................... 2005-0091582
Dec. 29, 2005 (KR) .......................... 2005-0133960

(51) Int. Cl.
*G11C 8/00* (2006.01)
(52) U.S. Cl. .............................. 365/233.1; 365/233.11; 365/233.12; 365/230.08; 365/233.5; 365/230.06
(58) Field of Classification Search ............. 365/233.1, 365/233.11, 233.12, 230.08, 233.5, 230.06
See application file for complete search history.

(56) References Cited

U.S. PATENT DOCUMENTS 5,430,676 A    7/1995    Ware et al.
5,544,124 A    8/1996    Zagar et al.
5,655,105 A *  8/1997    McLaury ..................... 711/169
5,655,113 A *  8/1997    Leung et al. ................. 713/401
5,682,393 A   10/1997    Ohsawa
5,892,730 A *  4/1999    Sato et al. .............. 365/233.16

(Continued)

FOREIGN PATENT DOCUMENTS

CN          1479314          3/2004

(Continued)

OTHER PUBLICATIONS

Korean Office Action issued in Korean Patent Application No. KR 10-2005-0133960, mailed Jul. 30, 2007.

(Continued)

*Primary Examiner*—Viet Q Nguyen
(74) *Attorney, Agent, or Firm*—IP & T Law Firm PLC

(57) ABSTRACT

An internal signal generator for use in a semiconductor memory device includes an internal read address generation unit and an internal write address generation unit. The internal read address generation unit generates a plurality of read delay addresses by delaying an external address for a predetermined latency shorter than an additive latency set by the semiconductor memory device and selects one of the read delay addresses to thereby output an internal read address. The internal write address generation unit generates a plurality of write delay addresses by delaying the internal read address for a preset latency shorter than a column address strobe (CAS) latency set by the semiconductor memory device and selects one of the write delay addresses to thereby output an internal write address.

7 Claims, 9 Drawing Sheets

U.S. PATENT DOCUMENTS

| | | | |
|---|---|---|---|
| 6,134,180 A | 10/2000 | Kim et al. | |
| 6,166,970 A | 12/2000 | Yun | |
| 6,262,938 B1 | 7/2001 | Lee et al. | |
| 6,324,116 B1 * | 11/2001 | Noh et al. | 365/230.05 |
| 6,337,830 B1 | 1/2002 | Faue | |
| 6,360,307 B1 | 3/2002 | Raftery et al. | |
| 6,453,381 B1 | 9/2002 | Yuan et al. | |
| 6,480,946 B1 * | 11/2002 | Tomishima et al. | 711/167 |
| 6,483,769 B2 * | 11/2002 | La | 365/194 |
| 6,539,454 B2 * | 3/2003 | Mes | 711/105 |
| 6,564,287 B1 | 5/2003 | Lee | |
| 6,862,250 B2 | 3/2005 | Shin | |
| 6,914,829 B2 | 7/2005 | Lee | |
| 6,922,764 B2 * | 7/2005 | Dortu et al. | 711/167 |
| 6,938,142 B2 | 8/2005 | Pawlowski | |
| 7,061,823 B2 * | 6/2006 | Faue et al. | 365/230.08 |
| 7,248,512 B2 | 7/2007 | Shin | |
| 7,251,172 B2 * | 7/2007 | Faue et al. | 365/194 |
| 7,280,430 B2 * | 10/2007 | Lee | 365/233.15 |
| 7,283,421 B2 * | 10/2007 | Lee | 365/233.15 |
| 7,286,394 B2 | 10/2007 | Ooishi | |
| 7,321,991 B2 * | 1/2008 | An | 714/42 |
| 7,340,577 B1 * | 3/2008 | Van Dyke et al. | 711/169 |
| 7,379,376 B2 | 5/2008 | Oh et al. | |
| 7,441,156 B2 * | 10/2008 | An | 714/42 |
| 2003/0031060 A1 | 2/2003 | Nishio et al. | |
| 2003/0185060 A1 | 10/2003 | Sato et al. | |
| 2004/0075128 A1 | 4/2004 | Mizuno et al. | |
| 2005/0105363 A1 | 5/2005 | Ko | |

FOREIGN PATENT DOCUMENTS

| | | |
|---|---|---|
| CN | 1503362 | 6/2004 |
| CN | 1508804 | 6/2004 |
| JP | 08-235857 | 9/1996 |
| JP | 10-260958 | 2/1998 |
| JP | 2002-133866 A | 5/2002 |
| KR | 2001-0062640 | 7/2001 |
| TW | 442793 | 6/2001 |
| TW | 0454189 | 9/2001 |
| WO | WO 2005/088644 A1 | 9/2005 |

OTHER PUBLICATIONS

Taiwanese Office Action and Search Report issued in Taiwanese Patent Application No. TW 095123967, dated May 7, 2008.

Notice of Allowance issued from the Chinese Patent Office on Oct. 28, 2009.

* cited by examiner

SEMICONDUCTOR MEMORY DEVICE

RELATED APPLICATIONS

This Application is a Divisional of U.S. application Ser. No. 11/478,124, filed Jun. 30, 2006, now U.S. Pat. No. 7,529,140 claiming priority of Korean Application No. 10-2005-0091582, filed Sep. 29, 2005 and Korean Application No1 10-2005-0133960, filed Dec. 29, 2005, the entire contents of each of which are hereby incorporated by reference.

FIELD OF THE INVENTION

The present invention relates to a semiconductor memory device, and more particularly to a semiconductor memory device for reducing power consumption.

DESCRIPTION OF RELATED ARTS

Typical semiconductor memory devices receive a read command or a write command after an active command is input and operations caused by the active command are completed. Hereinafter, a delay between an input timing of the active command and an input timing of the read command or the write command is referred to as tRCD. An address input with the read command or the write command is also input after tRCD.

However, it is possible for a semiconductor memory device including DDR2 SDRAM to set an input timing of the read command or the write command at any timing even before tRCD. The semiconductor memory device holds the read command or the write command input before tRCD for a predetermined time and generates an internal read command or an internal write command respectively corresponding to the read command and the write command after tRCD passes from the timing of the active command. The predetermined time between an input timing of the read command or the write command and a generation timing of the internal read command or the internal write command is referred as an additive latency (AL). Further, an address input with the read command or the write command is also held for the additive latency (AL) and, then, an internal address corresponding to the address is generated.

For example, in order to perform a read operation, DDR2 SDRAM generates an internal read address and an internal read command after the additive latency passes from the input timing of a read command. After a predetermined time from a generation time of the internal read command and the internal read address, DDR2 SDRAM starts to read valid data. The predetermined time between the generation timing of the internal read command and the internal address and a start timing of the read operation is referred to a column address strobe (CAS) latency (CL). DDR2 SDRAM starts to perform the read operation after the additive latency (AL) and the CAS latency (CL) from the input timing of the read command and the address. A value obtained by adding the CAS latency (CL) to the additive latency (AL) is referred to a read latency (RL).

In the case of a write operation, DDR2 SDRAM generates an internal write command and an internal write address and performs the write operation after a write latency (WL) from an input timing of a write command and an address. The write latency (WL) is less by one clock than the read latency (RL). That is, WL=RL−1=(AL+CL)−1.

SUMMARY OF THE INVENTION

Embodiments of the present invention are directed to an internal signal generator for reducing current consumption.

In accordance with an aspect of the present invention, there is provided an internal signal generator for use in a semiconductor memory device including an internal read address generation unit and an internal write address generation unit. The internal read address generation unit generates a plurality of read delay addresses by delaying an external address for a predetermined latency shorter than an additive latency set by the semiconductor memory device and selects one of the read delay address to thereby output an internal read address. The internal write address generation unit generates a plurality of write delay addresses by delaying the internal read address for a predetermined latency shorter than a column address strobe (CAS) latency set by the semiconductor memory device and selects one of the write delay addresses to thereby output an internal write address.

In accordance with another aspect of the present invention, there is provided a semiconductor memory device including an internal signal generation unit and a drive clock generation unit. The internal signal generation unit generates a plurality of delay signals by delaying an external signal for a predetermined latency shorter than a latency set by the semiconductor memory device in synchronism with a drive signal and selects one of the delay signal to thereby output an internal signal. The drive clock generation unit outputs an internal clock as the drive signal in response to the latency set by the semiconductor memory device.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 1:
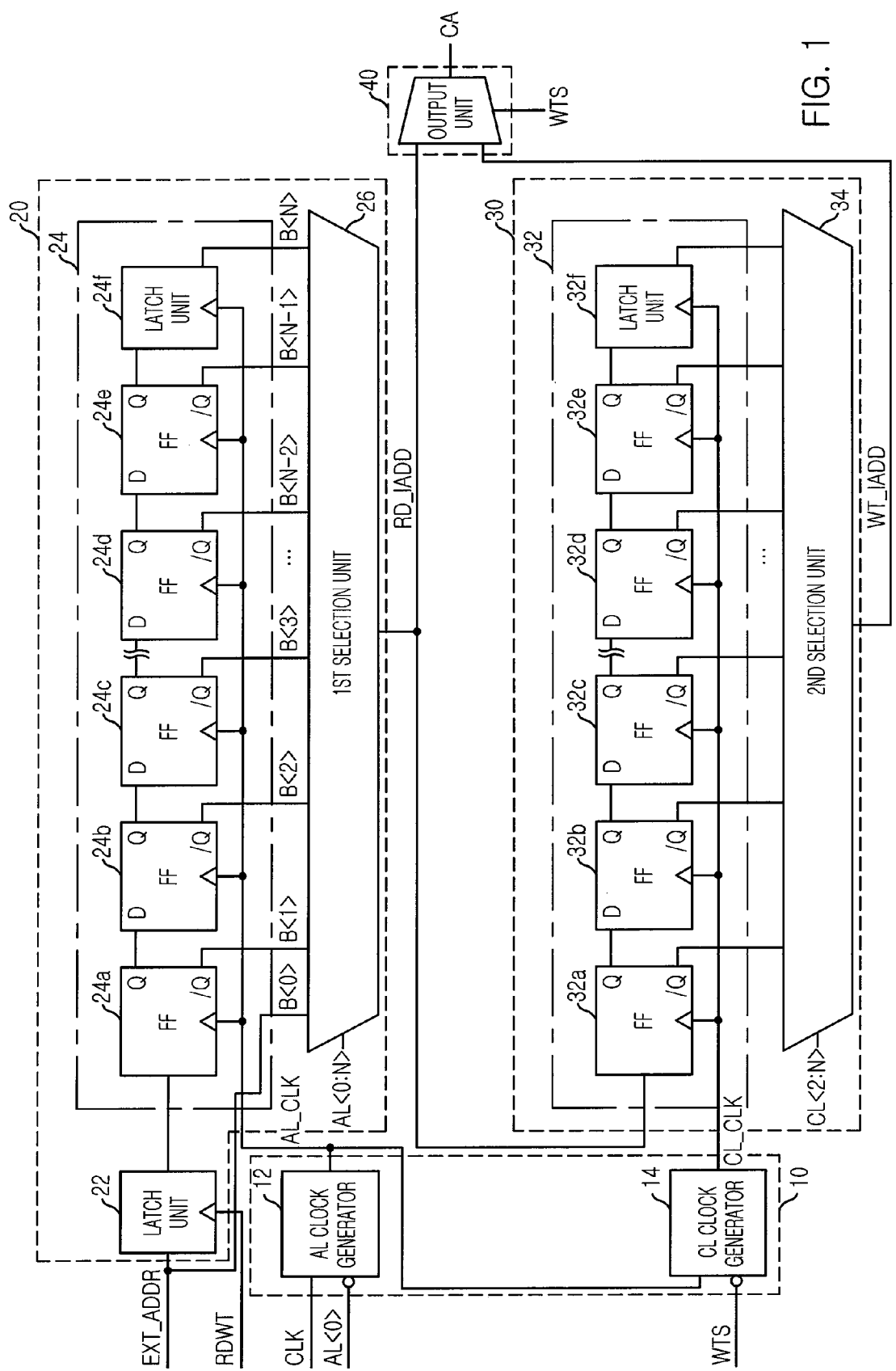
FIG. 1 is a block diagram describing an internal address generator of a semiconductor memory device in accordance with an embodiment of the present invention.

FIG. 1 is a block diagram describing an internal address generator of a semiconductor memory device in accordance with an embodiment of the present invention.

The internal address generator includes a drive clock generation unit 10, a read address generation unit 20, a write address generation unit 30, and an output unit 40.

The drive clock generation unit 10 outputs an additive drive clock AL_CLK or a CAS drive clock CL_CLK based on an internal clock CLK respectively in response to a zero additive latency signal AL<0> or a write state signal WTS. The zero additive latency signal AL<0> is a first bit of an additive latency signal AL<0:N> and is active when an additive latency of the semiconductor memory device is set to zero clocks. The write state signal WTS is activated during a write operation. The read address generation unit 20 delays an external address EXT_ADDR in response to the additive drive clock AL_CLK and outputs an internal read address RD_IADD corresponding to the additive latency of the semiconductor memory device. The write address generation unit 30 delays the internal read address RD_IADD in response to the CAS drive clock CL_CLK and outputs an internal write address WT_IADD corresponding to a CAS latency of the semiconductor memory device. The output unit 40 selects one of the internal read address RD_IADD and the internal write address WT_IADD in response to the write state signal WTS to thereby output an internal column address CA.

The drive clock generation unit 10 includes an additive clock generator 12 and a CAS clock generator 14. The additive clock generator 12 outputs the additive drive clock AL_CLK based on the internal clock CLK when the zero additive latency signal AL<0> is inactive. The CAS clock generator 14 outputs the CAS drive clock CL_CLK based on the internal clock CLK when the write state signal WTS is active.

The read address generation unit 20 includes a latch unit 22, a first flip-flop unit 24, and a first selection unit 26. The latch unit 22 latches the external address EXT_ADDR in response to a read/write flag RDWT. The read/write flag RDWT is active when the read command RD or the write command WT is input. The first flip-flop unit 24 receives an output of the latch unit 22 and delays the output in response to the additive drive clock AL_CLK to thereby output a plurality of delay addresses B<1:N>. The first selection unit 26 selects one of the delay addresses B<0:N> in response to activated one of the additive latency signal AL corresponding to the additive latency AL<0:N> of the semiconductor memory device and outputs the internal read address RD_IADD. The first delay address B<0> has the same phase with the external address EXT_ADDR. In other words, the external address EXT_ADDR is input as the first delay address B<0> to the first selection unit 16.

The first flip-flop unit 24 includes a plurality of flip-flops 24a to 24e serially connected to one another and a latch unit 24f. The first flip-flop 24a receives the output of the latch unit 22. The latch unit 24f is connected to the last flip-flop 24e.

The write address generation unit 30 includes a second flip-flop unit 32 and a second selection unit 34. The second flip-flop unit 32 receives the internal read address RD_IADD and delays the internal read address RD_IADD in response to the CAS drive clock CL_CLK to thereby output a plurality of CAS delay addresses. The second selection unit 34 selects one of the CAS delay addresses in response to activated one of CAS latency signals CL corresponding to the CAS latency of the semiconductor memory device.

The second flip-flop unit 32 includes a plurality of flip-flops 32a to 32e and a latch unit 32f. The first flip-flop 32a receives the internal read address RD_IADD. The latch unit 32f is connected to the last flip-flop 32e.

The output unit 40 has similar circuitry to the first and the second selection blocks 26 and 34 except for receiving the internal read address RD_IADD and the internal write address WT_IADD and outputting the internal column address CA in response to the write state signal WTS.

Figure 2A:
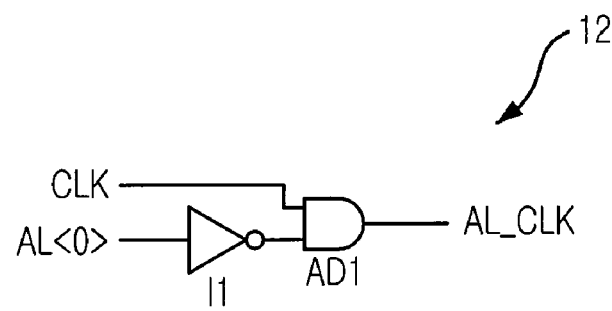
FIG. 2A is a schematic circuit diagram depicting a additive clock generator shown in FIG. 1.

FIG. 2A is a schematic circuit diagram depicting the additive clock generator 12 shown in FIG. 1.

The additive clock generator 12 includes a first inverter I1 and a first AND gate AD1. The first inverter I1 inverts the zero additive latency signal AL<0>. The first AND gate AD1 logically combines an output of the first inverter I1 and the internal clock CLK to thereby output the additive drive clock AL_CLK. The additive drive clock AL_CLK is active when the active latency of the semiconductor memory device is set to more than zero clocks. The CAS clock generator 14 has similar circuitry to that of the additive clock generator 12 except for receiving the write state signal WTS and the additive drive clock AL_CLK instead of the zero additive latency signal AL<0> and the internal clock CLK.

Figure 2B:
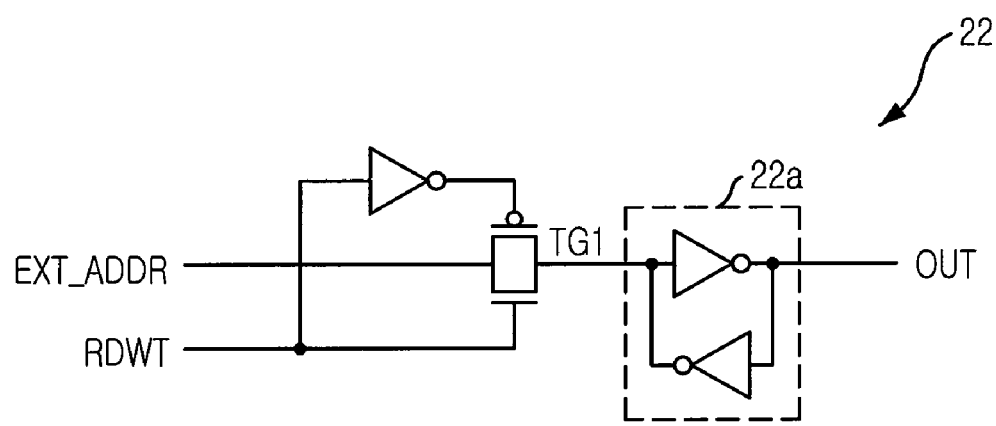
FIG. 2B is a schematic circuit diagram showing a latch unit 22 shown in FIG. 1.

FIG. 2B is a schematic circuit diagram showing the latch unit 22 shown in FIG. 1.

The latch unit 22 includes a first transmission gate TG1 and a latch 22a. The first transmission gate TG1 transmits the external address EXT_ADDR when the read/write flag RDWT is active as a logic high level. The read/write flag RDWT is active when the read or the write command is input. The latch 22a latches an output of the first transmission gate TG1. The latch unit 22 transmits the external address EXT_ADDR in response to an activation of the read/write flag RDWT. The latch units 24f and 32f respectively included in the first and the second flip-flop units 24 and 32 have similar circuitry to that of the latch unit 22.

Figure 2C:
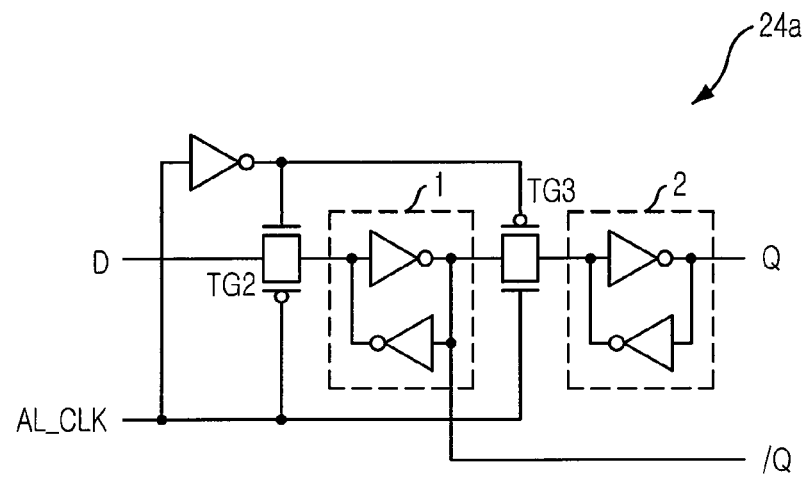
FIG. 2C is a schematic circuit diagram describing a first flip-flop included in a read address generation unit shown in FIG. 1.

FIG. 2C is a schematic circuit diagram describing the first flip-flop 24a included in the read address generation unit 20 shown in FIG. 1.

The first flip-flop 24a includes two transmission gates TG2 and TG3 and two latches 24a_1 and 24a_2. The second transmission gate TG2 transmits data input through an input terminal D in response to the additive drive clock AL_CLK of a logic low level. The first latch 24a_1 inverts and latches an output of the second transmission gate TG2 and outputs a first output /Q. The third transmission gate TG3 transmits the first output /Q in response to the additive drive clock AL_CLK of a logic high level. The second latch 24a_2 inverts and latches an output of the third transmission gate TG3 and outputs a second output Q. That is, the first flip-flop 24a outputs the first output /Q synchronism with a falling edge of the additive drive clock AL_CLK and the second output Q synchronized with a rising edge of the additive drive clock AL_CLK. The other flip-flops included in the first flip-flop unit 24 and the second flip-flop unit 32 have similar circuitry to that of first flip-flop 24a.

Figure 2D:
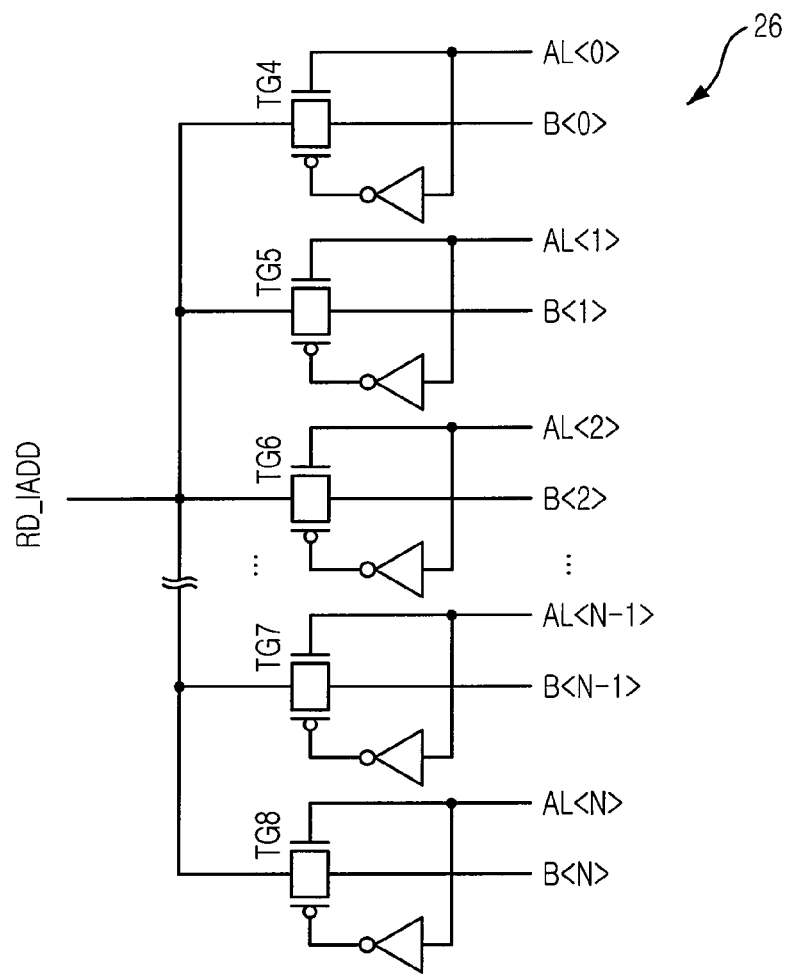
FIG. 2D is a schematic circuit diagram describing a first selection unit shown in FIG. 1.

FIG. 2D is a schematic circuit diagram describing the first selection unit 26 shown in FIG. 1.

The first selection unit 26 includes a plurality of transmission gates TG4 to TG8. Each of the transmission gates TG4 to TG8 transmits corresponding delay addresses B<0:N> in response to corresponding additive latency signal AL<0:N>. For example, when the second additive latency signal AL<1> is activated as a logic high level, the fifth transmission gate TG5 transmits the first output /Q of the first flip-flop 24a, i.e., the second delay address B<1>, to thereby output the internal read address RD_IADD. The second selection unit 34 and the output unit 40 have similar circuitry to that of the first selection unit 32.

Figure 3:
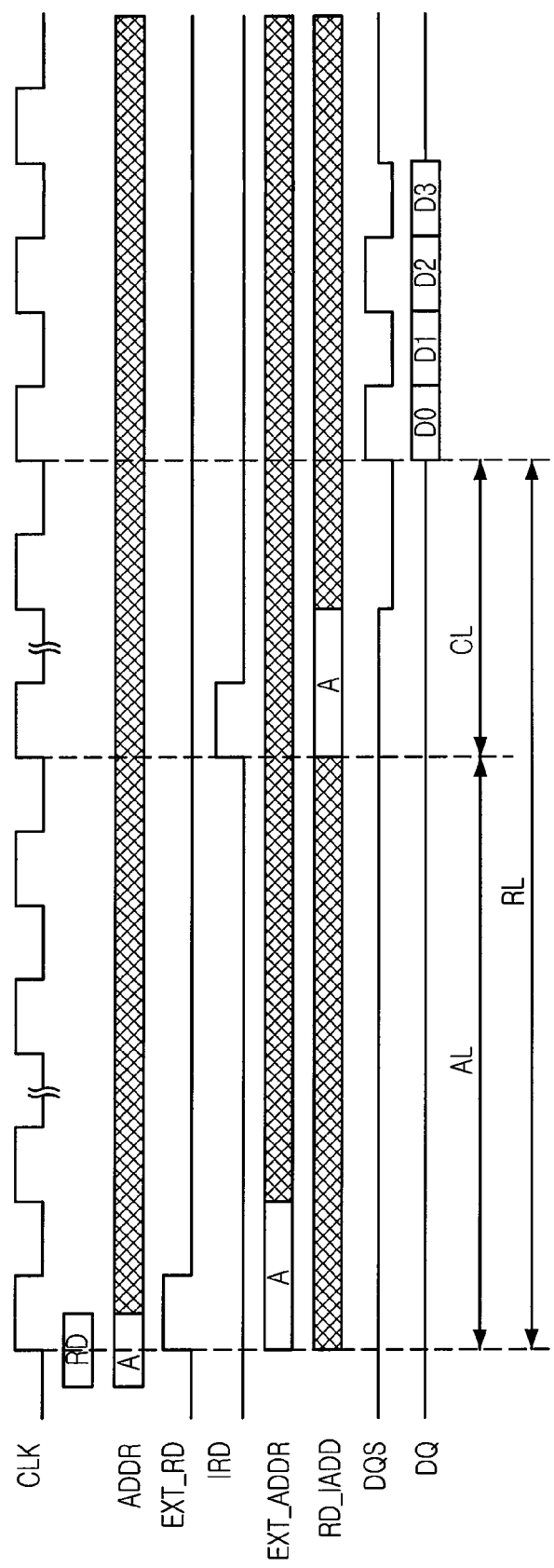
FIG. 3 is a timing diagram demonstrating a read operation of the internal address generator shown in FIG. 1.

FIG. 3 is a timing diagram demonstrating a read operation of the internal address generator shown in FIG. 1.

It is presumed that a burst length, denoting the number of data output by one read command RD, is four; the additive latency AL is four clocks; and the CAS latency is two clocks.

First, when a read command RD and an address ADDR are input, an external read signal EXT_RD and the external address EXT_ADDR are activated in synchronism with the internal clock CLK. Because the additive latency AL is not zero, the drive clock generation unit 10 outputs the additive drive clock AL_CLK based on the internal clock CLK. The write state signal WTS is inactive because the read command RD is input. Therefore, the drive clock generation unit 10 does not output the CAS drive clock CL_CLK.

The latch unit 22 transmits the external address EXT_ADDR in response to the read/write flag RDWT activated by the read command RD. The first flip-flop unit 24 outputs the delay addresses B<0:N> serially activated in response to the additive drive clock AL_CLK. The first selection unit 26 selects the fifth delay address B<4> in response to the fifth additive latency signals AL<4> corresponding to the additive latency AL of the semiconductor memory device, i.e., 4 clocks, and outputs the internal read address RD_IADD. The output unit 40 outputs the internal column address CA based on the internal read address RD_IADD.

That is, the internal column address CA is activated after 4 clocks corresponding to the additive latency AL of the semiconductor memory device is passed from an input timing of the external address EXT_ADDR. An internal read command IRD is activated after 4 clocks corresponding to the selected additive latency signal, i.e., AL<4>, is passed from an input timing of the external read signal EXT_RD.

The CAS clock generator 14 in the drive clock generation unit 10 does not activate the CAS drive clock CL_CLK. Therefore, the second flip-flop unit 32 in the write address generation unit 30 is not activated and, therefore, the internal write address WT_IADD is not activated.

After two clocks corresponding to the CAS latency AL of the semiconductor memory device is passed from an activation timing of the internal read command IRD is passed, four bit address D0 to D3 are output.

Figure 4:
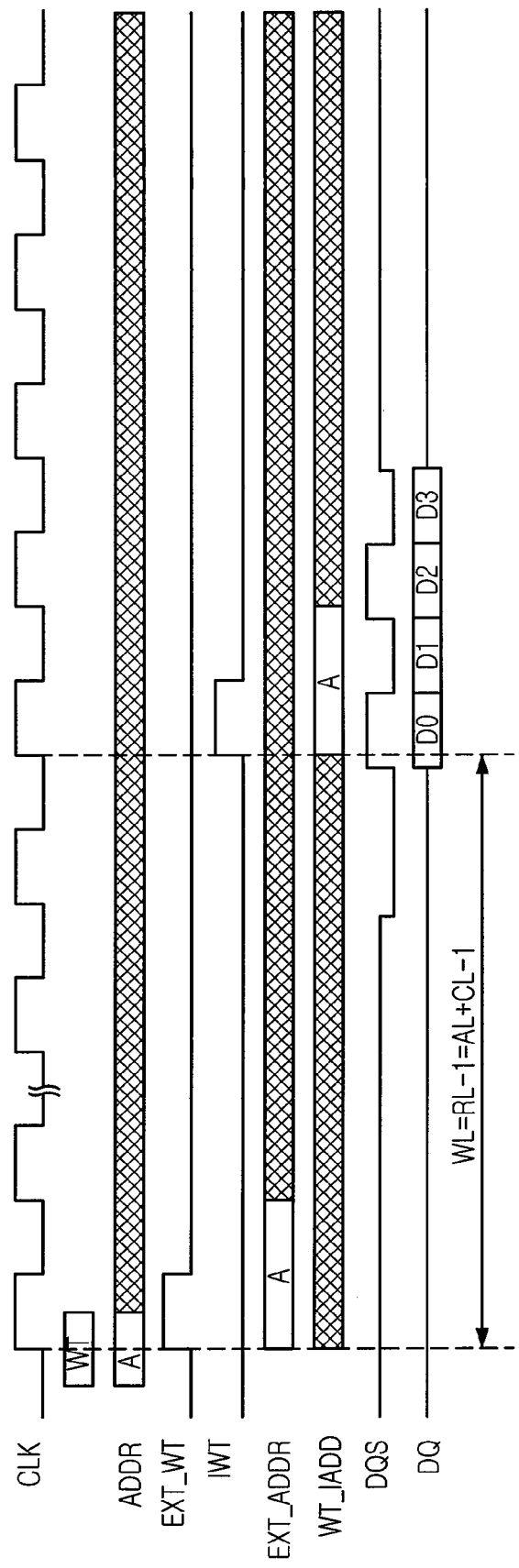
FIG. 4 is a timing diagram demonstrating a write operation of the internal address generator shown in FIG. 1.

FIG. 4 is a timing diagram demonstrating a write operation of the internal address generator shown in FIG. 1.

As in the case shown in FIG. 3, it is presumed that a burst length, denoting the number of data bits output by one read command RD, is four; the additive latency AL is four clocks; and the CAS latency is two clocks.

First, when a write command WT and an address are input, an external write signal EXT_WT and the external address EXT_ADDR are activated. Because the additive latency AL is not zero, the drive clock generation unit 10 outputs the additive drive clock AL_CLK based on the internal clock CLK. Further, the drive clock generation unit 10 outputs the CAS drive clock CL_CLK based on the additive drive clock AL_CLK in response to an activation of the write state signal WTS.

The latch unit 22 transmits the external address EXT_ADDR in response to the read/write flag RDWT activated by the write command WT. The first flip-flop unit 24 outputs the delay addresses B<0:N> serially activated in response to the additive drive clock AL_CLK. The first selection unit 26 selects the fifth delay address B<4> in response to the fifth additive latency signals AL<4> corresponding to the additive latency AL of the semiconductor memory device, i.e., 4 clocks, and outputs the internal read address RD_IADD.

The second flip-flop unit 32 in the write address generation unit 30 outputs the plurality of CAS delay addresses serially activated in response to the CAS drive clock CL_CLK. The second selection unit 34 selects one of the CAS delay addresses corresponding to the second CAS latency CL<2> and outputs the internal write address WT_IADD. The output unit 40 outputs the internal column address CA based on the internal write address WT_IADD in response to the write state signal WTS.

That is, the internal column address CA is activated after 5 clocks corresponding to a write latency WL of the semiconductor memory device is passed from an input timing of the external address EXT_ADDR. Further, an internal write command IWT is activated after 5 clocks are passed from an input timing of the external write signal EXT_WT. The data D0 to D3 starts to be input at an activation timing of the internal write command IWT.

The internal address generator shown in FIG. 1 drives all flip-flops in the first and the second flip-flop units 24 and 32 without reference to the additive latency AL and the CAS latency CL. For example, when the additive latency AL is four clocks and the CAS latency CL is two clocks, the internal address generator uses four flop-flops in the first flip-flop unit 24, i.e., the first to the fourth flip-flops, in case of the read operation. In the case of the write operation, the internal address generator uses five flip-flops, i.e., the first to the fourth flip-flops in the first flip-flop unit 24 and the first flip-flop in the second flip-flop unit 32. However, the internal address generator drives all flip-flops including those not being used. Therefore, the internal address generator is wasteful of power consumption.

Figure 5:
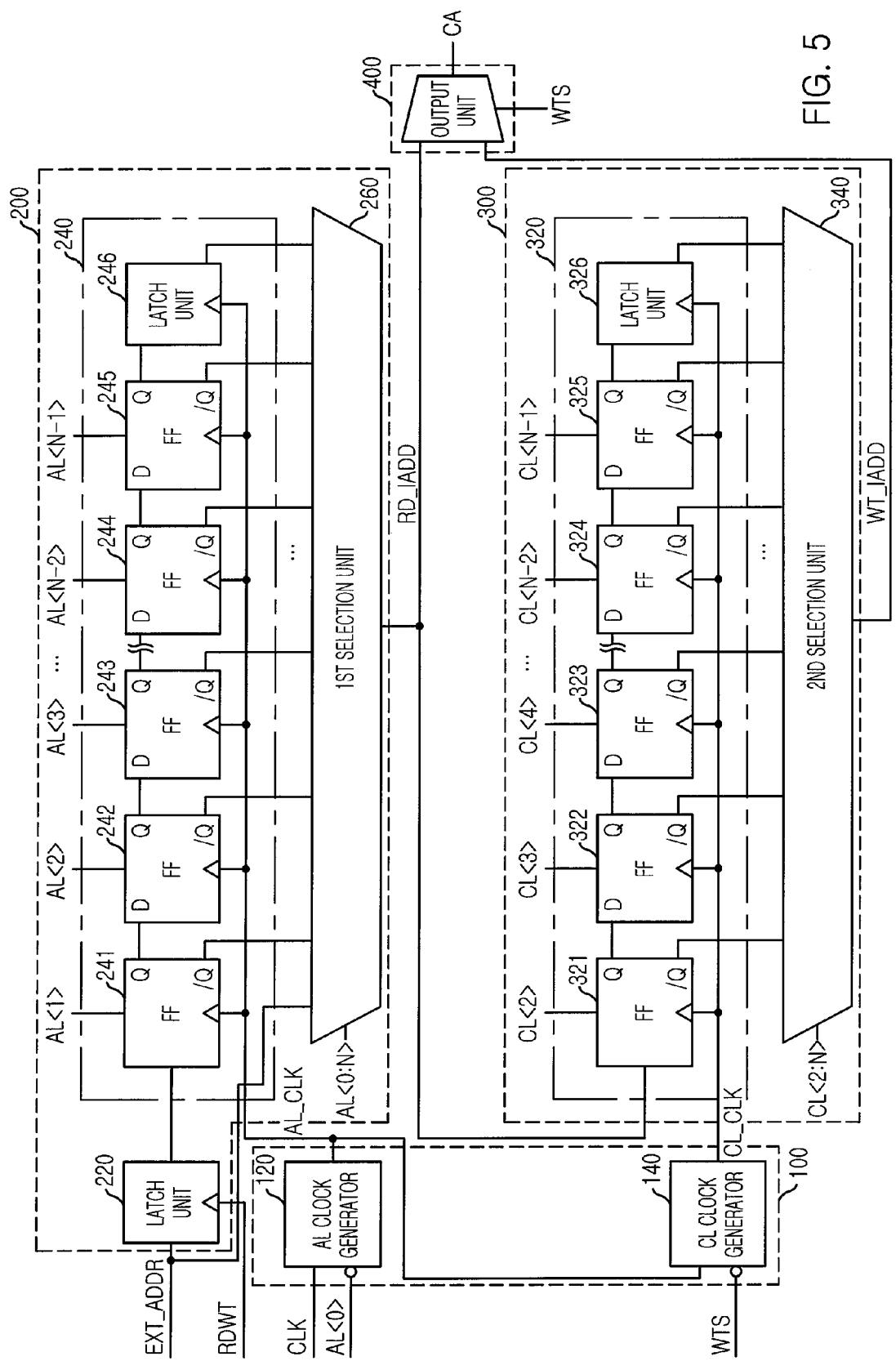
FIG. 5 is a block diagram showing an internal address generator in accordance with another embodiment of the present invention.

FIG. 5 is a block diagram showing an internal address generator in accordance with an embodiment of the present invention.

The internal address generator includes a drive clock generation unit 100, a read address generation unit 200, a write address generation unit 300, and an output unit 400.

The drive clock generation unit 100 outputs an additive drive clock AL_CLK or a CAS drive clock CL_CLK based on an internal clock CLK respectively in response to a zero additive latency signal AL<0> and a write state signal WTS. The read address generation unit 200 delays an external address EXT_ADDR in response to an additive latency signal AL<1:N−1> in synchronism with the additive drive clock AL_CLK and outputs an internal read address RD_IADD corresponding to the additive latency of the semiconductor memory device. The write address generation unit 300 delays the internal read address RD_IADD in response to a CAS latency signal CL<2:N−1> in synchronism with the CAS drive clock CL_CLK and outputs an internal write address WT_IADD corresponding to a CAS latency of the semiconductor memory device. The output unit 400 selects one of the internal read address RD_IADD and the internal write address WT_IADD in response to the write state signal WTS and outputs an internal column address CA.

The drive clock generation unit 100 includes an additive clock generator and a CAS clock generator. The additive clock generator outputs the additive drive clock AL_CLK based on the internal clock CLK when the zero additive latency signal AL<0> is inactive. The CAS clock generator outputs the CAS drive clock CL_CLK based on the internal clock CLK when the write state signal WTS is active.

The read address generation unit 200 includes a latch unit 220, a first flip-flop unit 240, and a first selection unit 260. The latch unit 220 latches the external address EXT_ADDR in response to a read/write flag RDWT. The first flip-flop unit 240 receives an output of the latch unit 220 and delays the output in response to the additive drive clock AL_CLK and to thereby output a plurality of delay addresses. The first selection unit 260 selects one of the delay addresses in response to active one of the additive latency signal AL<0:N> and outputs the internal read address RD_IADD.

The first flip-flop unit 240 includes a plurality of flip-flops, e.g., 241, serially connected one another and a latch unit 246. The first flip-flop 241 receives the output of the latch unit 22. Each flip-flop delays an input signal input through an input terminal D and outputs a second output through its second output terminal /Q and a first output through its first output terminal Q. The second output /Q is output as the delay address. The latch unit 246 receives the first output of the last flip-flop 245 and outputs the last delay address B<N>.

The write address generation unit 300 includes a second flip-flop unit 320 and a second selection unit 340. The second flip-flop unit 320 receives the internal read address RD_IADD and delays the internal read address RD_IADD in response to the CAS drive clock CL_CLK to thereby output a plurality of CAS delay addresses. The second selection unit 340 selects one of the CAS delay addresses in response to activated one of CAS latency signals CL<2:N>.

The second flip-flop unit 320 includes a plurality of flip-flops, e.g., 321, and a latch unit 326. The first flip-flop 321 receives the internal read address RD_IADD through its input terminal D. Each flip-flop receives an input signal through its input terminal D and outputs a second output through its second output terminal /Q and a first output through its first output terminal Q. The second output is output as the CAS delay address. The latch unit 32f receives the first output of the last flip-flop 325 and outputs the last CAS delay address.

Figure 6:
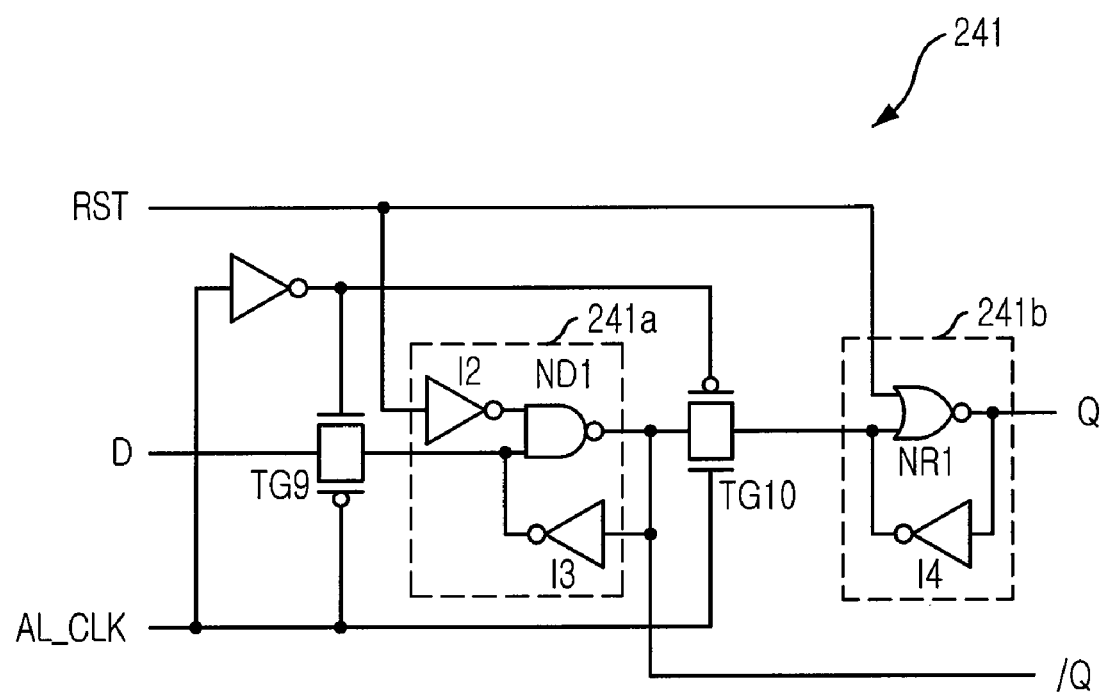
FIG. 6 is a schematic circuit diagram depicting a flip-flop in a first flip-flop unit shown in FIG. 5.

FIG. 6 is a schematic circuit diagram depicting the flip-flop in the first flip-flop unit 240 shown in FIG. 5.

Every flip-flop included in the first flip-flop unit 240 and the second flip-flop unit 320 has similar structure as that shown in FIG. 6.

As shown, the first flip-flop 241 includes two transmission gate TG9 and TG10 and two latches 241a and 241b. The ninth transmission gate TG9 transmits the input signal input through its input terminal D in response to the additive drive clock AL_CLK of a logic low level. The first latch 241a latches an output of the ninth transmission gate TG9 and outputs the second output as the delay address through the second output terminal /Q when a reset signal RST is inactive. When the reset signal RST is active, the first latch 241a resets the second output as a logic high level. The tenth transmission gate TG10 transmits an output of the first latch 241a in response to the additive drive clock AL_CLK of a logic high level. The second latch 241b latches an output of the tenth transmission gate TG10 and outputs the first output through the first output terminal Q when the reset signal RST is inactive. When the reset signal RST is active, the second latch 241b resets the first output as a logic low level.

The first latch 241a includes two inverters I2 and I3 and a first NAND gate ND1. The second inverter I2 inverts the reset signal RST. The first NAND gate ND1 logically combines an output of the second inverter I2 and the output of the ninth transmission gate TG9. The third inverter I3 inverts the output of the first NAND gate ND1. An output terminal of the third inverter I3 is connected to an output terminal of the ninth transmission gate TG9. The second latch 241b includes a first NOR gate NR1 and a fourth inverter I4. The first NOR gate NR1 logically combine the reset signal RST and the output of the tenth transmission gate TG10. The fourth inverter I4 inverts an output of the first NOR gate NR1. An output terminal of the fourth inverter I4 is connected to an output terminal of the tenth transmission gate TG10.

When the reset signal RST is active, the first flip-flop 241 resets the first output as the logic low level and the second output as the logic high level. When the reset signal RST is inactive, the first flip-flop 241 outputs an input signal through the second output terminal /Q in synchronism with a falling edge of the additive drive clock AL_CLK. The first flip-flop 241 outputs the input signal through the first output terminal Q in synchronism with a rising edge of the additive drive clock AL_CLK. When the reset signal RST is active, the other flip-flops included in the first flip-flop unit 240, e.g., 242, 243,244, and 245, receiving the first output of logic low level, are turned off. The reset signal RST is correspond to the additive latency signal AL<1:N-1>.

For example, when the additive latency of the semiconductor memory device is set to three clocks and the read command RD and an external address EXT_ADDR are input, the drive clock generation unit 100 enables the additive drive clock AL_CLK. The CAS drive clock CL_CLK is inactive because the write state signal WTS is inactive. The latch unit 220 latches the external address EXT_ADDR in response to the read/write flag RDWT which is enabled by an input of the read command RD. Because the additive latency of the semiconductor memory device is set to three clocks, the fourth additive latency signal AL<3> is active and the second and the third additive latency signals AL<1> and AL<2> are inactive. Therefore, the first and the second flip-flops 241 and 242 are serially turned on and serially outputs the delay addresses B<1> and B<2> in response to the additive drive clock AL_CLK. The first output of the third flip-flop 243 which receives the fourth additive latency signal AL<3> is reset to the logic low level. Accordingly, the flip-flops, e.g., 244 and 245, connected behind the third flip-flop 243 are turned off. The first selection unit 260 selects one of the delay addresses corresponding to the fourth additive latency signal AL<3> and outputs as the internal read address RD_IADD. The internal read address is output through the output driver 400 as the internal column address CA.

As above described, the internal address generator of the present invention reduces current consumption by using flip-flops reset by the additive latency signal AL and the CAS latency signal CL. That is, the flip-flops which are not used to generate the delay address corresponding the additive latency or the CAS latency of the semiconductor memory device are turned off and, thus, the current consumed by the flip-flops can be reduced. As the internal address generator shown in FIG. 5 is respectively provided for every bit of the external address EXT_ADDR, the current consumption effect is dramatically increased by the present invention.

Figure 7:
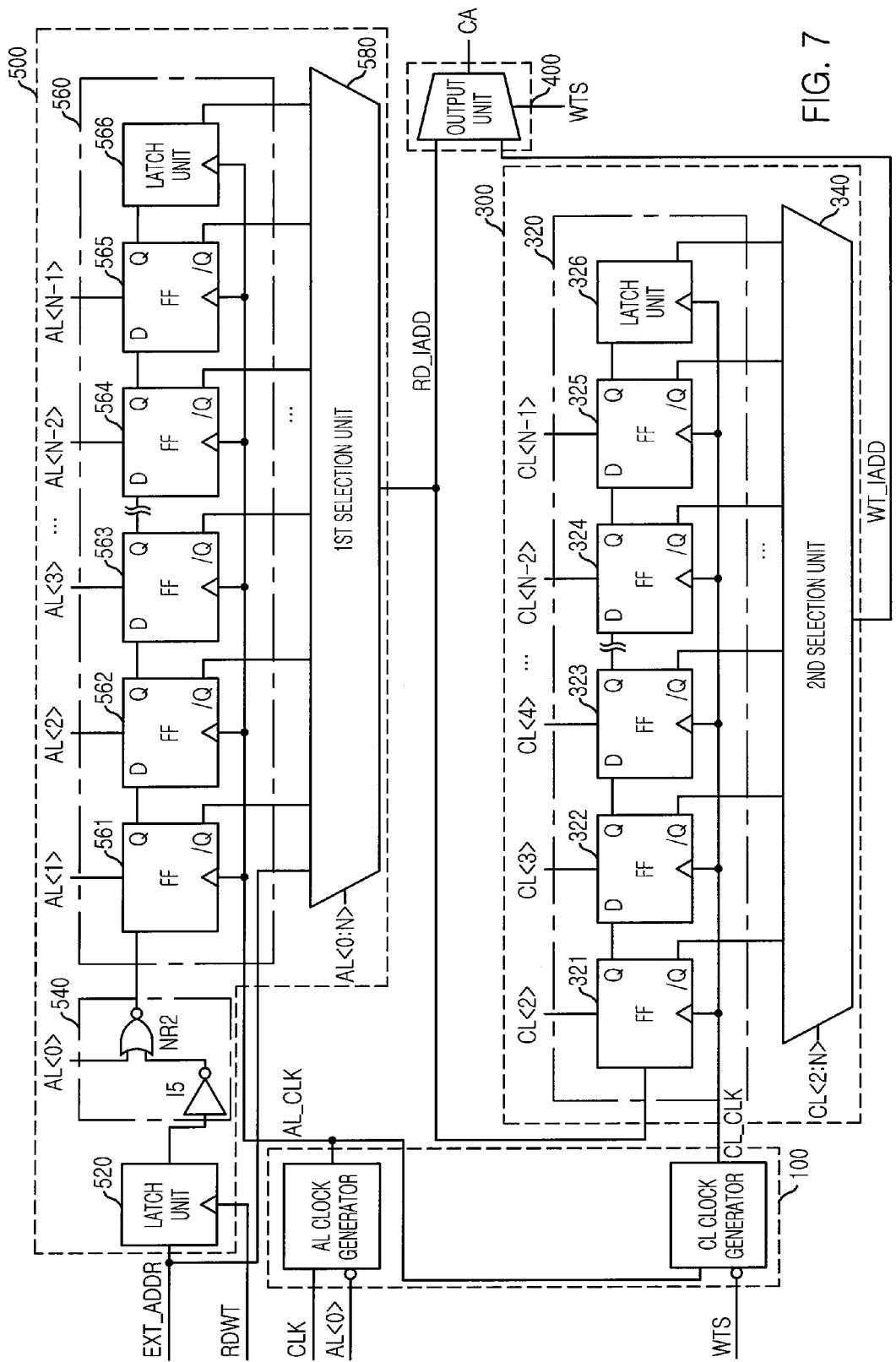
FIG. 7 is a block diagram describing an internal address generator in accordance with still another embodiment of the present invention.

FIG. 7 is a block diagram describing an internal address generator in accordance with another embodiment of the present invention.

In FIG. 7, the same or similar elements as those of FIG. 5 are designated by the same reference numerals, and a detailed description thereof will not be made in order to avoid redundancy. Drive clock generation unit 100, write address generation unit 300, and output unit 400 included in the internal address generator shown in FIG. 7 are similar with those shown in FIG. 5. Internal structure of a read address generation unit 500 is different from that shown in FIG. 5.

The read address generation unit 500 includes a latch unit 520, an input control unit 540, an additive flip-flop unit 560, and a first selection unit 580. The latch unit latches the external address EXT_ADDR in response to the read/write flag RDWT. The input control unit 540 transmits an output of the latch unit 520 controlled by the zero additive latency signal AL<0>. The additive flip-flop unit 560 receives an output of the input control unit 540 and delays the output in response to the additive drive clock AL_CLK to thereby output a plurality of delay addresses. The first selection unit 580 selects one of the delay addresses in response to active one of the additive latency signal AL<0:N> and outputs the internal read address RD_IADD.

The input control unit 540 includes a fifth inverter I5 and a second NOR gate NR2. The fifth inverter I5 inverts the output of the latch unit 520. The second NOR gate NR2 logically combines an output of the fifth inverter I5 and the zero additive latency signal AL<0>. The additive flip-flop unit 560 includes a plurality of flip-flops, e.g., 561, and a latch unit 566. Each flip-flop, e.g., 561, reset by corresponding additive latency signal, e.g., AL<1>, receives an input signal through its input terminal D and outputs a first and a second output respectively through a first and a second output terminal Q and /Q in response to the additive drive clock AL_CLK. The second output of each flip-flop output through the second output terminal /Q is the delay address. The latch unit 566 latches the first output of the last flip-flop 565 and outputs the last delay address.

Figure 8:
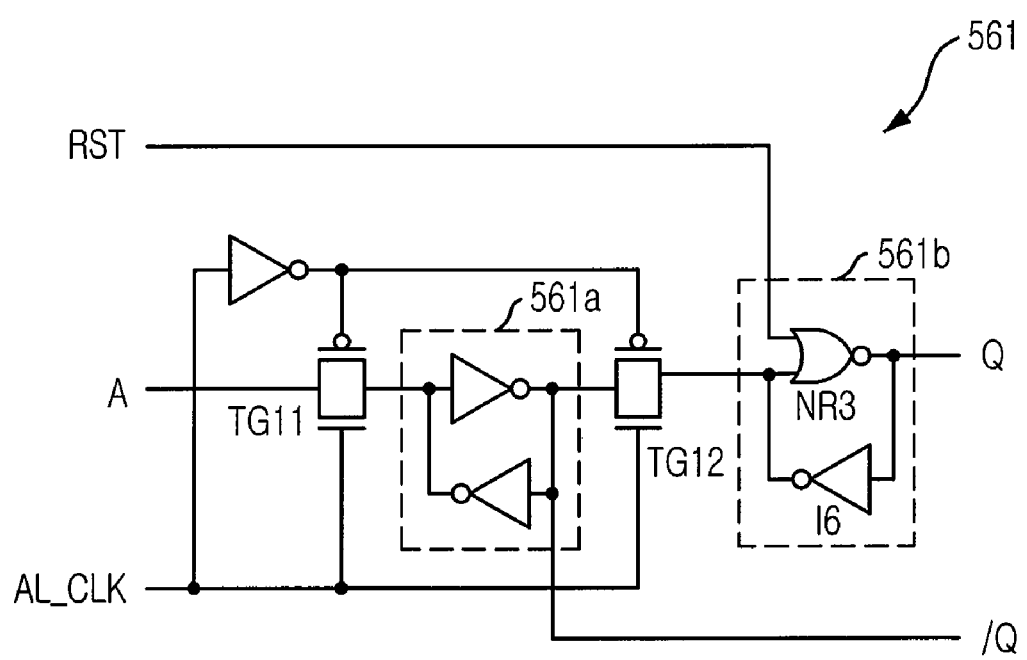
FIG. 8 is a schematic circuit diagram depicting the flip-flop shown in FIG. 7.

FIG. 8 is a schematic circuit diagram depicting the flip-flop shown in FIG. 7.

The flip-flop, e.g., 561, includes two transmission gates TG11 and TG12 and two latches 561a and 561b. The eleventh transmission gate TG11 transmits the input signal in response to the additive drive clock AL_CLK of a logic low level. The first latch 561a latches an output of the eleventh transmission gate TG11 and output as the delay address through the second output terminal /Q. The twelfth transmission gate TG12 transmits an output of the twelfth transmission gate TG12 in response to the additive drive clock AL_CLK of a logic high level. The second latch 561b resets the first output of the flip-flop when the reset signal RST is active and latches and outputs an output of the twelfth transmission gate TG12 when the reset signal RST is inactive. The second latch 561b includes a third NOR gate NR3 and a sixth inverter I6. The third NOR gate NR3 logically combines the reset signal RST and the output of the twelfth transmission gate TG12. The sixth inverter I6 inverts an output of the third NOR gate NR3. An output terminal of the sixth inverter I6 is connected to an output terminal of the twelfth transmission gate TG12.

The flip-flop shown in FIG. 8 resets the first output as a logic low level when the reset signal is active as a logic high level. When the reset signal is inactive, the flip-flop outputs the input signal through the second output terminal /Q in synchronism with the falling edge of the additive drive clock AL_CLK and through the first output terminal Q in synchronism with the rising edge of the additive drive clock AL_CLK. Similar to the flip-flop shown in FIG. 6, the flip-flop shown in FIG. 8 is reset by the corresponding additive latency signal. For example, when the additive latency of the semiconductor memory device is set to two clocks, the third additive latency signal AL<2> is active. The first output of the second flip-flop 562 receiving the third additive latency signal AL<2> is reset as a logic low level. Accordingly, the flip-flops, e.g., 563, connected behind of the second flip-flop 562 and the latch unit 566 are turned off. As a result, an internal address generator using the flip-flops shown in FIG. 8 is possible to reduce current consumption.

Though the internal address generators are only used for generating an internal column address in the abovementioned embodiments, the present invention is also used for generating internal commands and an internal bank address.

The present invention reduces the current consumption by using delay elements which are reset by corresponding additive latency and CAS latency.

The present application contains subject matter related to Korean patent application No. 2005-091582 and No. 2005-133960, filed in the Korean Patent Office on Sep. 29, 2005 and on Dec. 29, 2005, respectively, the entire contents of which are incorporated herein by references.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
an internal signal generation unit configured to generate a plurality of delay signals by delaying an external signal for a predetermined latency shorter than a latency set by the semiconductor memory device in synchronism with a drive clock and select one of the delay signals to output an internal signal; and
a drive clock generation unit configured to output an internal clock as the drive clock in response to the latency set by the semiconductor memory device,
wherein the internal signal generation unit includes:
a flip-flop unit configured with a plurality of serially connected flip-flops to generate the plurality of delay signals by delaying the external signal for the predetermined latency; and
a selection unit configured to select one of the delay signals corresponding to a latency signal having information about the latency to thereby output the internal signal.

2. The internal signal generator as recited in claim 1, wherein the flip-flop unit includes:
the plurality of flip-flops, each of which outputs a first and a second output respectively though a first and a second output terminal, wherein the first output is transmitted to an input terminal of the next flip-flop and the second output is output as the delay signal; and
a latch unit configured to output the first output of the last flip-flop as the last delay signal in response to the drive clock,
wherein the first flip-flop receives the external signal and the plurality of the flip-flops are respectively reset by the latency signals.

3. The internal signal generator as recited in claim 2, wherein each of the flip-flops resets the first and the second outputs in response to the activation of the latency signal and outputs an input signal though the second output terminal in synchronism with a falling edge of the drive clock or though the first output terminal in synchronism with a rising edge of the drive clock when the latency signal is inactivated.

4. The internal signal generator as recited in claim 2, wherein each of the flip-flops resets the first and the second outputs in response to the activation of the latency signal and outputs an input signal though the second output terminal in synchronism with a rising edge of the drive clock and though the first output terminal in synchronism with a falling edge of the drive clock when the latency signal is inactivated.

5. The internal signal generator as recited in claim 3, wherein each of the flip-flops includes:
a first transmission gate for transmitting the input signal in response to the drive clock of a first logic level;
a first latch for resetting the second output to a second logic level when a reset signal is activated and latching an output of the first transmission gate to output the delay signal through the second output terminal when the reset signal is inactivated;

a second transmission gate for transmitting an output of the first latch in response to the drive clock of the second logic level; and a second latch for resetting the first output to the first logic level when the reset signal is activated and latching an output of the second transmission gate to output the first output when the reset signal is inactivated, wherein the reset signal is the latency signal.

6. The internal signal generator as recited in claim 5, wherein the first latch includes:

a first inverter for inverting the reset signal;

a NAND gate for logically combining an output of the first inverter and the output of the first transmission gate; and a second inverter for inverting an output of the NAND gate, wherein an output terminal of the second inverter is connected to an output terminal of the first transmission gate.

7. The internal signal generator as recited in claim 6, wherein the second latch includes:

a NOR gate for logically combining the reset signal and the output of the second transmission gate; and a third inverter for inverting an output of the NOR gate, wherein an output terminal of the third inverter is connected to an output terminal of the second transmission gate.

\* \* \* \* \*